(12) United States Patent
Carden et al.

(10) Patent No.: US 6,224,711 B1
(45) Date of Patent: *May 1, 2001

(54) ASSEMBLY PROCESS FOR FLIP CHIP PACKAGE HAVING A LOW STRESS CHIP AND RESULTING STRUCTURE

(75) Inventors: Timothy F. Carden, Vestal; Aleksander Zubelewicz, Binghamton, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/140,077

(22) Filed: Aug. 25, 1998

(51) Int. Cl.[7] .............................. B32B 31/00; H01L 23/48
(52) U.S. Cl. .......................... 156/311; 438/118; 438/127; 257/790
(58) Field of Search .................................. 438/106, 108, 438/118, 119, 124, 126, 127, FOR 369; 257/778, 790; 156/311

(56) References Cited

U.S. PATENT DOCUMENTS

| 4,942,140 | 7/1990 | Ootsuki et al. . | |
|---|---|---|---|
| 5,249,101 | 9/1993 | Frey et al. . | |
| 5,300,459 | 4/1994 | Oshikubo et al. . | |
| 5,477,611 | 12/1995 | Sweis et al. . | |
| 5,535,101 | 7/1996 | Miles et al. . | |
| 5,668,059 | 9/1997 | Christie et al. . | |
| 5,670,826 | 9/1997 | Bessho et al. . | |
| 5,710,071 | * 1/1998 | Beddingfield et al. | 438/108 |
| 5,726,079 | * 3/1998 | Johnson | 438/106 |
| 5,777,386 | * 7/1998 | Higashi et al. | 257/778 X |
| 5,814,882 | * 9/1998 | Shimada et al. | 257/778 X |
| 5,866,943 | * 2/1999 | Mertol | 257/778 X |
| 5,891,753 | * 4/1999 | Akram | 438/108 |
| 5,969,426 | * 10/1999 | Baba et al. | 257/778 |
| 6,046,077 | * 8/2000 | Baba | 438/127 |
| 6,104,093 | * 8/2000 | Caletka et al. | 257/778 |

OTHER PUBLICATIONS

"Module Assembly Process" Technical Bulletin No. 305, RD 30548, Kenneth Mason Publications Ltd., England, Sep. 1989.

* cited by examiner

Primary Examiner—Mark A. Osele
(74) Attorney, Agent, or Firm—James A. Lucas; Driggs, Lucas, Brubaker & Hogg Co., LPA

(57) ABSTRACT

A method for assembling a flip-chip package having a low stress chip comprises providing a laminate chip carrier having a chip electrically connected thereon, applying the underfill material between the chip and the laminate chip carrier, providing a cover plate and applying an adhesive to the cover plate or chip or both, placing the cover plate adjacent to the chip such that the adhesive contacts the chip and the cover plate, and curing the underfill material together with the adhesive. The resultant flip-chip package has low internal stress and experiences enhanced fatigue life during thermal cycling.

2 Claims, 2 Drawing Sheets

ASSEMBLY PROCESS FOR FLIP CHIP PACKAGE HAVING A LOW STRESS CHIP AND RESULTING STRUCTURE

BACKGROUND

1. Field of the Invention

This invention relates generally to a method of producing a flip chip package and resulting structure, and more specifically, to a method that produces a low stress flip chip package that is resistant to thermal fatigue and the resulting structure.

2. Description of Related Art

One type of flip chip package includes one or more chips mounted on a substrate, one type of which is conventionally termed a laminate chip carrier. The laminate chip carrier is usually mounted on a printed circuit card or circuit board. In the "flip-chip" configuration, the chip is mounted with electrical contacts thereon, mounted onto solderable metal pads of the laminate chip carrier, using solder balls, sometimes referred to as solder joints.

A flip-chip package typically requires an underfill material to reinforce the solder joints that are prone to fatigue failure due to thermal cycling. The underfill material encompasses the solder interconnections between the chip and the laminate chip carrier.

In an effort to increase thermal dissipation and flatness of the flip-chip package, the packages frequently include a conductive stiffener mounted on the laminate chip carrier and a cover plate mounted on the chip. The stiffener, usually comprised of metal, is preferably mounted onto the laminate chip carrier such that the stiffener surrounds the perimeter of the chip and is preferably about the same height as the chip. The cover plate typically has a surface area greater than the chip, and the cover plate is generally centered on the chip with the overhang of the cover plate resting on the stiffener. In conventional processes, the cover plate is added after the soldered connections have been made, and after the underfill material has been applied and cured. The cover plate is mounted onto the chip and stiffener typically with the application of an adhesive. The adhesive, in addition to adhering the cover plate to the chip and stiffener, is typically a conductive adhesive that improves the transfer of heat from the chip to the cover plate.

A well-known problem with the flip-chip packages, in general, is thermal fatigue failure. The differences in the coefficient of thermal expansion (CTE) of the flip-chip package materials, that is, the chip, laminate substrate, stiffener, cover plate, underfill and adhesive, causes increased stress within the package. During the operation of the flip-chip package, thermally induced stress causes the package to bend and warp, and may cause the underfill or adhesive to delaminate, the soldered joints to fracture, or the chip to crack. Soldered connections that connect the flip-chip package to the circuit card or circuit board are also susceptible to thermal fatigue.

It is desirable to produce a flip-chip package that has reduced stress throughout the temperature range encountered in manufacture and in use to enhance fatigue life. It is also desirable to produce a flip chip package that can withstand wider temperature ranges. It is also desirable to produce a flip-chip package that exhibits minimal warpage.

SUMMARY OF THE INVENTION

The invention herein provides for a flip-chip package and a method of producing a flip-chip package that has enhanced product life through stress balancing. The method of producing a flip-chip package of the invention herein comprises the steps of: providing a laminate dielectric chip carrier having electrical circuitry disposed within and preferably a stiffener mounted onto a portion of the laminate chip carrier; mounting a chip onto the laminate chip carrier and electrically connecting the electrical contacts on a first or active surface of the chip to the circuitry of the laminate chip carrier; preferably cleaning the first surface of the chip and the portion of the laminate chip carrier directly opposite the first surface of the chip; applying an underfill material between the chip and the laminate chip carrier; preferably gelling the underfill material from running along the laminate substrate; providing a cover plate and applying an adhesive to the cover plate adjacent to a second surface of chip such that the adhesive contacts the cover plate and the chip to form an assembly; simultaneously curing the underfill material and adhesive until the underfill material and the adhesive are fully cured.

The underfill material is preferably applied as a liquid material, and when cured, it become sufficiently rigid to withstand forces applied by thermal stress. As soon as the underfill material is applied, the underfill material can be gelled by applying heat. The underfill material is gelled when it forms an outer "skin" and thus prevents the underfill material from running along the surface of the laminate chip carrier. It is important, however, that the underfill material and the adhesive are cured to a final cure when exposed to the same temperature and pressure profile. The result is a flip-chip package having reduced stress among the flip-chip package components. The internal stresses between the laminate chip carrier, chip, cover plate, adhesive, and underfill are balanced, that is, brought to a near zero stress state, by fully curing the underfill material and the adhesive together under the same temperature and pressure profile.

When the adhesive and underfill materials are substantially cured the result is a flip-chip assembly having reduced internal stress and improved flatness. The glass transition temperature (Tg) of the underfill material should be higher than the operating temperature of the flip-chip package to ensure package flatness and long-term reliability.

BRIEF DESCRIPTION OF THE DRAWINGS

The above-mentioned features of this invention, and the manner of attaining them will become more apparent by reference to the following drawings and the descriptions which follow.

DETAILED DESCRIPTION OF THE INVENTION

The invention herein provides for a method of making a flip-chip package with reduced thermally induced stress on the chip and other flip-chip package components. A reduction of the internal stress imposed on the components during the manufacture of the flip-chip package, enhances the fatigue life of the flip-chip package during operation.

Figure 1:
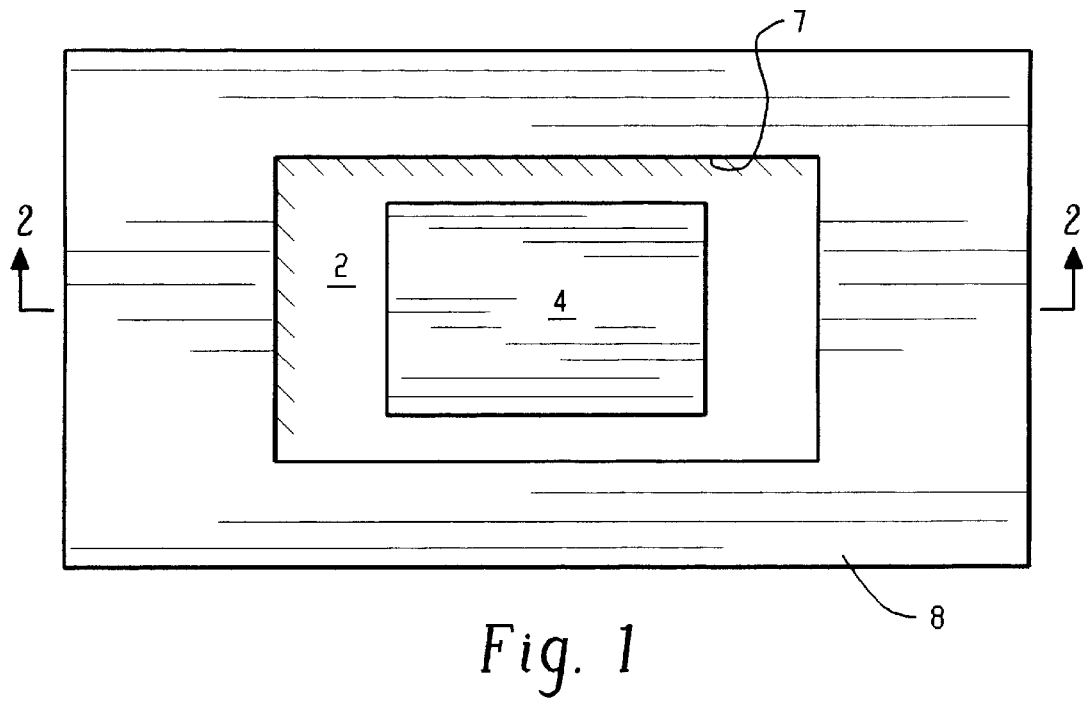
FIG. 1 is a top plan view of a chip and a stiffener both mounted onto a laminate chip carrier.
Figure 2:
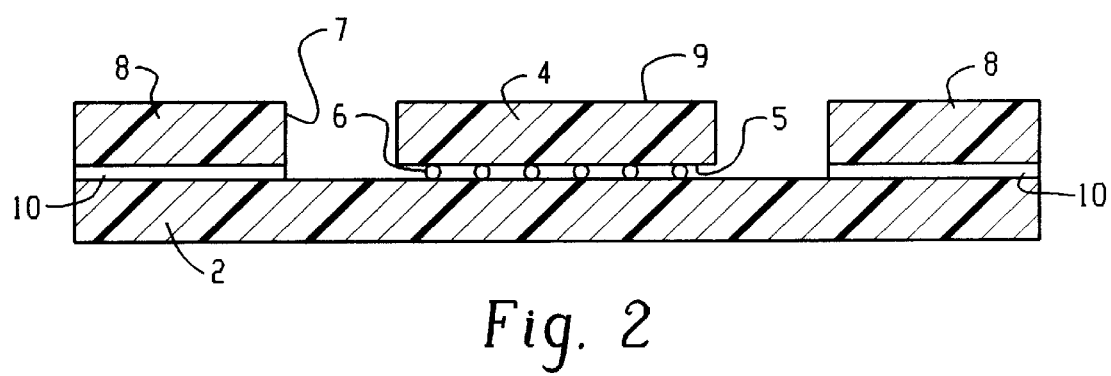
FIG. 2 is a sectional view taken substantially on the plane designated by the line 2—2 of FIG. 1 illustrating the soldered interconnections between the chip and the laminate chip carrier.

Referring to FIGS. 1 and 2, a laminate chip carrier 2 has attached stiffener 8 that surrounds chip 4. Stiffener 8 has a length and width which are approximately equal to the corresponding dimensions of laminate chip carrier 2, and is cut-out in the center to frame chip 4. The length and width dimensions of laminate chip carrier 2 are commonly in the range of about 25 mm to about 50 mm, and the length and width dimensions of chip 4 are preferably between about 5 mm to about 20 mm. Stiffener 8 preferably has about a 4 mm to about a 6 mm gap between the periphery of chip 4 and inner surfaces 7 of stiffener 8.

Laminate chip carrier 2 is comprised of materials well known in the art. These materials include, for example, dielectric materials such as polyimide, FR-4 (a fiberglass impregnated with epoxy), fluorocarbons and polytetrafluoroethylene. Specifically, a suitable material is an epoxy glass composite commercially available as DriClad® from IBM Corporation. More preferably, laminate chip carrier 2 is comprised of alternating layers of dielectric material and conductive material. The dielectric layers are preferably comprised of those cited above, and the conductive layers are preferably comprised of metal and more preferably copper or Invar or combinations thereof. Laminate chip carrier 2 has a CTE that preferably ranges from about 9 ppm/° C. to about 20 ppm/° C.

If a stiffener is employed in the flip-chip package, stiffener 8 is preferably comprised of metal and more preferably copper, which has a CTE that is close to the overall CTE of laminate chip carrier 2. For example, the CTE of a copper stiffener is about 17 ppm/° C. The cross-sectional view of FIG. 2 shows stiffener 8 is attached to laminate chip carrier 2 preferably by adhesive 10. Stiffener 8 provides a counterforce to laminate chip carrier 2 and assures dimensional stability of the flip-chip package when laminate chip carrier 2 may tend to bow, twist or warp during the thermal cycling as a result of the differences in the CTE between the laminate chip carrier 2 and chip 4.

Chip 4 is comprised of materials well known in the art, such as, for example, silicon, germanium and gallium arsenide. Chip 4 typically has a CTE that is much lower than the CTE of laminate chip carrier 2. For example, the CTE of a silicon 35 chip ranges from about 2.6 ppm/° C. to about 3 ppm/° C. FIG. 2 shows chip 4 having a plurality of electrical contacts (not shown) on first or active surface 5 that are electrically connected, for example, by soldered joints 6 to corresponding contacts associated with one or more electrical circuits disposed in laminate chip carrier 2.

After the electrical contacts are connected as soldered joints 6, it is preferred that the flux residue of the solder be cleaned. Flux residue of the solder typically remains on the first surface 5 of chip 4 and the portion of laminate chip carrier 2 opposite chip 4. The surfaces are preferably treated by a plasma etch process in a vacuum plasma chamber. The plasma etch process removes flux residue and roughens the surfaces to promote adhesion. The details of cleaning via plasma etch are well known in the art. Processing parameters are determined experimentally and depend upon the material, size and geometry of both the chip and the laminate chip carrier.

Figure 3:
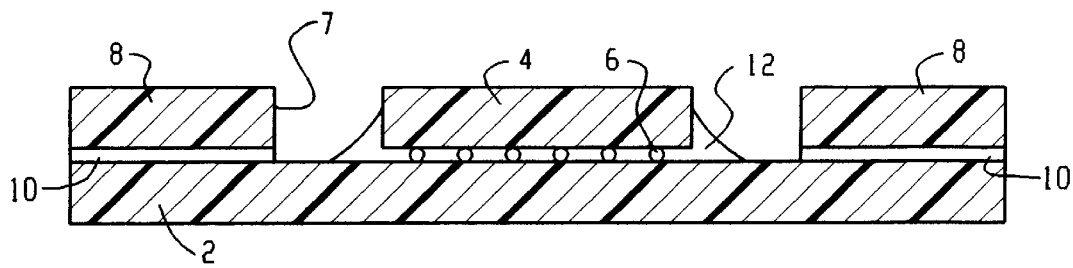
FIG. 3 is a view similar to FIG. 2 illustrating the chip, the stiffener and the laminate chip carrier after the underfill material has been applied between the chip and the laminate chip carrier; and, FIG. 4 is a view similar to FIG. 3 illustrating the assembly having a cover plate attached to the chip and stiffener with conductive adhesive and the assembly loaded into a fixture.

Next, underfill material 12 is dispensed between chip 4 and laminate chip carrier 2, preferably filling the gap to eliminate voids as shown in FIG. 3. Underfill materials are well known in the art and include, for example, filled epoxies. A suitable underfill material, for example, is Hysol 4511 which is a glass filled epoxy commercially available from Dexter Corporation. Underfill material 12 is preferably a liquid when applied yet substantially rigid when fully cured. An underfill material that is substantially rigid when fully cured is needed to prevent deformation of laminate chip carrier 2 to relax the loads being applied to solder joints. The modulus of underfill material 12 should be high enough to substantially redistribute the internal stresses created by the expansion and contraction of the components of the flip-chip package. For example, Hysol 4511 that is fully cured, has a flexural modulus of about 1300 kpsi. Underfill material 12 preferably has a CTE that can range from about 20 ppm/° C. to about 30 ppm/° C. and is preferably within the same range of the CTE of the solder joint.

Underfill material 12 is preferably gelled, prior to subsequent method steps. An underfill material is generally said to be gelled when it forms a "skin" and is not fully cured. Underfill material 12 is gelled so that it does not flow as a liquid. A gelled underfill material is one that remains in place yet is flexible enough to absorb stress to secure the solder joints, such as C4 solder bumps, during the remaining steps of the assembly process. The conditions to achieve a gelled underfill material depend upon the chemical nature of the underfill material employed and the physical requirements needed to achieve an outer "skin" of the underfill material. For example, many known underfill materials, such as Hysol 4511, are gelled between about 120° C. to about 150° C., and preferably closer to about 120° C. for about 5 minutes.

Figure 4:
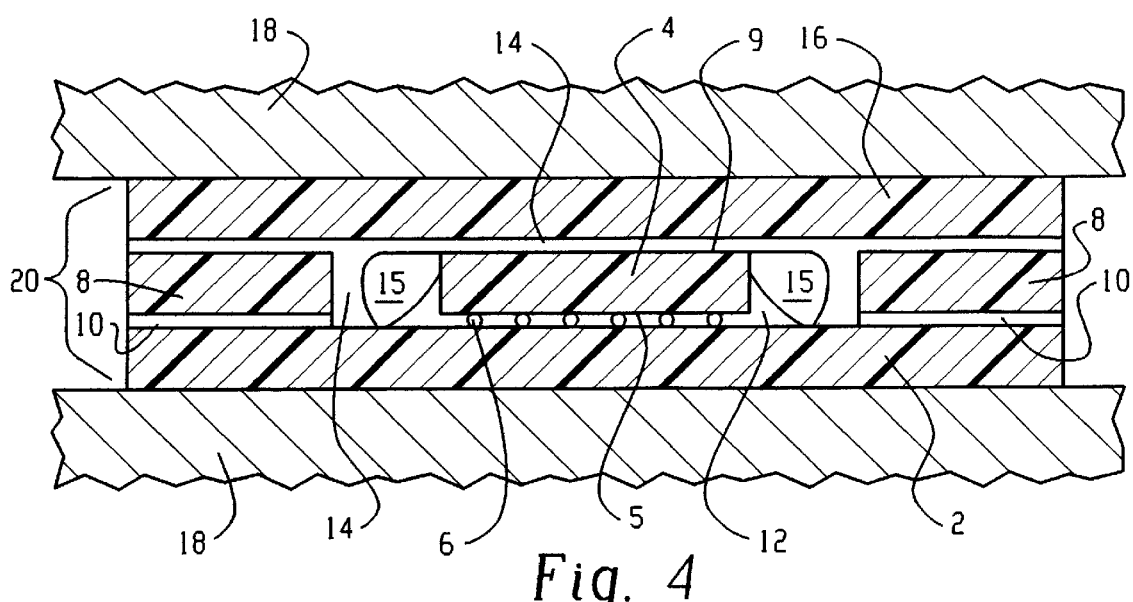

After underfill material 12 is applied, adhesive 14 is applied as shown in FIG. 4. Adhesive 14 is applied onto cover plate 16 or chip 4 or combinations thereof such that adhesive 14 contacts second surface 9 of chip 4 opposite surface 5. Adhesive 14 adheres to cover plate 16 and also, if present, to stiffener 8. Adhesives are well known in the art and may be chosen according to the heat transfer coefficient and the adhesive properties required to adhere cover plate 16 to chip 4. Preferably, adhesive 14 has a cure temperature of underfill material 12. Adhesives include, for example, a silicone or a filled epoxy. A suitable conductive adhesive is commercially available as Silicone 3281 from the General Electric Company.

Next, underfill material 12 and adhesive 14 are fully cured by simultaneously exposing them to the same temperature and pressure profile. When an underfill material is fully cured, the physical properties achieve about their full potential and such physical properties remain approximately constant. Fully cured means that the physical properties is within the range set forth by the material manufacturer as fully cured. For example, if the underfill material is a thermosetting epoxy, it is fully cured after undergoing a chemical crosslinking reaction such that the epoxy has achieved physical properties, such as tensile strength, modulus, and elongation, that are within the range specified by the material manufacturer. More specifically, for example, the Hysol 4511 epoxy described above is fully cured when it is about 99% crosslinked.

FIG. 4 shows assembly 20 is placed within fixture 18. Fixture 18 is capable of being heated, and thus, applies pressure and heat to assembly 20 to advance the cure of underfill material 12 and adhesive 14. At this stage the flip-chip package composite structure is at a near zero stress state. Pressure and heat are applied to assembly 20 until underfill material 12 and adhesive 14 are both less than fully cured. Both underfill material 12 and adhesive 14 are preferably less than about 95% cured, and more preferably, in the range of about 50% to 80% cure, and even more preferably, about 75% cured. If heat and pressure greater than ambient conditions are needed to cure the underfill and adhesive materials, any method or apparatus that applies heat and pressure to the assembly can be used. For example, a suitable fixture that can receive assembly 20 is a Carver Press.

The pressure applied should be sufficient to extrude adhesive 14 such that adhesive 14 contacts chip 4 and laminate chip carrier 2, and if present, stiffener 8. The pressure applied is also great enough to keep assembly 20 substantially flat. As pressure is applied, voids 15 may be created between cover plate 16 and laminate chip carrier 2 along the periphery of chip 4. It is desirable that pressure be applied such that adhesive 14 has a thickness of about 2 to 3 mils between chip 4 and cover plate 16. The exact pressure and temperature profile applied depends upon the viscosity of the underfill material and the adhesive as they cure. The applied pressure is that applied to both fixture 18 and assembly 20. For example, when Hysol 4511 is used as the underfill material and GE Silicone 3281 is used as the conductive adhesive, the temperature of assembly 20 preferably ranges from about 100° C. to about 110° C. and the applied pressure preferably ranges from about 1000 psi to about 5000 psi, depending upon the design of the fixture.

When adhesive 14 and underfill 12 are less than fully cured, and more preferably about 75% cured, assembly 20 is preferably removed from fixture 18 and underfill material 12 and adhesive 14 are fully cured at a thermal profile that preferably comprises two stages. The first stage temperature is preferably maintained at less the recommended cure temperature of both underfill material 12 and adhesive 14. For example, the Hysol 4511 and the Silicone 3281 have recommended cure temperatures that range from about 110° C. to about 150° C., and they are preferably cured together in the first stage of the thermal profile at a range from about 110° C. to about 130° C. The second stage temperature is preferably closer or approximately equal to or even higher than the cure temperatures of underfill material 12 and conductive adhesive 14. For example, the Hysol 4511 and Silicone 3281 are preferably cured together in the second stage of the thermal profile at a range from about 130° C. to about 150° C.

The first stage temperature is applied preferably until underfill material 12 and adhesive 14 are both about 90% or more cured, and the second stage temperature is preferably applied to assembly 20 until underfill material 12 and adhesive 14 are at least 95% cured. The degree of curing that is achieved by the adhesive and underfill materials depends upon the specific materials that are used. The underfill material and the adhesive should be cured such that they achieve optimum physical properties, such as, for example, chemical resistance. It is also preferable that the $T_g$ of the underfill material, when fully cured, is above the operating temperature of the flip-chip package to minimize distortion. Hysol 4511, for example, has a Tg of about 155° C.

The method described herein allows underfill material 12 to stay substantially flexible prior to curing adhesive 14. Since both the adhesive and the underfill material undergo curing simultaneously, the internal stresses created between the laminate chip carrier, the chip, the stiffener, the cover plate, the underfill and the adhesive achieve nearly stress equilibrium during the cure. Preferably, the flip-chip package achieves final cure at a temperature that is greater than the operating temperature of the resulting flip-chip package. Hence, physical distortions of the completed flip-chip package during operation are thereby reduced.

Other modifications and variations of the present invention are possible in light of the above teachings. It is to be understood, however, that changes may be made in the particular embodiments described above which are within the full-intended scope of the invention as defined in the appended claims.

What is claimed is:

1. A method of making a flip-chip package having a laminate chip carrier and a chip having a first surface electrically connected to circuitry disposed within the laminate chip carrier, and the chip carrier having a second surface opposite the first surface of the chip, the method comprising:
    applying an underfill material disposed between the chip and the laminate chip carrier;
    providing a cover plate;
    applying an adhesive to the cover plate or the chip or the combinations thereof;
    placing the cover plate adjacent to the second surface of the chip such that the adhesive contacts the second surface of the chip and the cover plate to form an assembly;
    simultaneously curing the underfill material and the adhesive until the underfill material and the adhesive are fully cured under a pressure and temperature profile that nearly balances the net stress between the chip, the laminate chip carrier, the cover plate, the adhesive and the underfill, said pressure and temperature profile comprising:
    applying a temperature of between about 100° C. to about 110° C. to the assembly while applying a pressure that keeps the assembly substantially flat until the underfill material and the adhesive are about 50% to about 80% cured;
    applying to the assembly a temperature that is less than the cure temperature of both the underfill material and the adhesive until the underfill material and the adhesive are at least about 90% cured;
    applying to the assembly a temperature that is approximately equal to or greater than the cure temperature of the underfill material and the adhesive until the underfill material and the adhesive are at least about 95% cured.

2. A method of making a flip-chip package having a laminate chip carrier with a stiffener attached thereon and a first surface of a chip electrically connected to circuitry disposed within the laminate chip carrier, and the chip having a second surface opposite to the first surface of the chip, the method comprising:
    applying an underfill material disposed between the chip and the laminate chip carrier;
    providing a cover plate;
    applying a conductive adhesive to the cover plate or chip or stiffener or combinations thereof;
    placing the cover plate adjacent to the second surface of the chip such that the adhesive contacts the chip and the cover plate to form an assembly; and
    exposing the assembly to the same pressure and temperature profile which comprises:
    applying a temperature of between about 100° C. to about 110° C. to the assembly while applying a pressure that keeps the assembly substantially flat until the underfill material and the adhesive are about 50% to about 80% cured;
    applying to the assembly a temperature that is less than the cure temperature of both the underfill material and the adhesive until the underfill material and the adhesive are at least about 90% cured; and applying to the assembly a temperature that is approximately equal to or greater than the cure temperature of the underfill material and the adhesive until the underfill material and the adhesive are at least about 95% cured, such that the underfill material and the adhesive are substantially fully cured.

* * * * *